(12) United States Patent
Lee et al.

(10) Patent No.: US 7,084,482 B2
(45) Date of Patent: Aug. 1, 2006

(54) CAPACITOR OF A SEMICONDUCTOR DEVICE AND MEMORY DEVICE USING THE SAME

(75) Inventors: Jung-hyun Lee, Yongin-si (KR); Bum-seok Seo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/917,532

(22) Filed: Aug. 13, 2004

(65) Prior Publication Data

US 2005/0082595 A1  Apr. 21, 2005

(30) Foreign Application Priority Data

Aug. 13, 2003  (KR) ....................... 10-2003-0056034

(51) Int. Cl.
*H01L 29/00* (2006.01)
(52) U.S. Cl. ...................... 257/532; 257/296
(58) Field of Classification Search ........... 257/532, 257/68, 71, 296, 758, 76
See application file for complete search history.

(56) References Cited

U.S. PATENT DOCUMENTS

| | | | | |
|---|---|---|---|---|
| 5,189,503 A | * | 2/1993 | Suguro et al. | 257/310 |
| 5,438,541 A | * | 8/1995 | Ando | 365/182 |
| 5,691,220 A | * | 11/1997 | Ohnishi et al. | 438/253 |
| 5,831,284 A | * | 11/1998 | Park et al. | 257/68 |
| 6,207,489 B1 | | 3/2001 | Nam et al. | |
| 2002/0030191 A1 | | 3/2002 | Das et al. | |
| 2002/0115252 A1 | | 8/2002 | Haukka et al. | |
| 2003/0036239 A1 | | 2/2003 | Lim et al. | |

FOREIGN PATENT DOCUMENTS

EP  0 046 868  3/1982

* cited by examiner

*Primary Examiner*—S. V. Clark
(74) *Attorney, Agent, or Firm*—Lee & Morse, P.C.

(57) ABSTRACT

A capacitor of a semiconductor device includes a lower electrode, a dielectric layer, including a plurality of band gaps, formed on the lower electrode, and an upper electrode formed on the dielectric layer. A band gap of the plurality of band gaps in the dielectric layer that is not adjacent to either the lower electrode or the upper electrode is smaller than a band gap of the plurality of band gaps in the dielectric layer adjacent to the lower electrode and a band gap of the plurality of band gaps in the dielectric layer adjacent to the upper electrode.

22 Claims, 6 Drawing Sheets

CAPACITOR OF A SEMICONDUCTOR DEVICE AND MEMORY DEVICE USING THE SAME

BACKGROUND OF THE INVENTION

1. Field of the Invention

The present invention relates to a semiconductor device. More particularly, the present invention relates to a capacitor of a semiconductor device and a memory device using the same.

2. Description of the Related Art

A semiconductor device, such as a memory device, includes a transistor and a capacitor. A function of the capacitor is to maintain data in a normal state for a relatively long period of time. To accomplish this function, the capacitor has a capacitance that is greater than a certain value.

As a degree of integration of a memory device increases, an area in which a capacitor may be formed decreases. Regardless of this decrease in area, a capacitance of a capacitor should be increased, or at least should not be decreased.

In view of this situation, research for a capacitor that can be applied to a highly integrated memory device has been conducted. In this research, a method of thinning a dielectric layer, a method of utilizing ferroelectric substances, and a method of combining the two methods have been used.

FIG. 1 illustrates a cross-sectional view of a capacitor included in a semiconductor device according to the prior art.

Referring to FIG. 1, a conventional capacitor includes a lower electrode 10, a hafnium oxide ($HfO_2$) layer 12, and an upper electrode 14.

As the degree of integration of the memory device increases, a leakage current of the conventional capacitor increases.

Accordingly, the $HfO_2$ layer 12, which is used as a dielectric layer, should be as thin as possible. However, as the $HfO_2$ layer 12 is made thinner, e.g., around 4.5 nm thick, the leakage current of the capacitor significantly increases. Thus, the memory device including the conventional capacitor does not function properly.

FIG. 2 is a graph of a leakage current density of the capacitor of FIG. 1 versus voltage according to a thickness of the $HfO_2$ layer 12.

Referring to FIG. 2, first and second curves G1 and G2 represent the characteristics of the leakage current when the $HfO_2$ layer 12 has a thickness much greater than 4.5 nm. Third and fourth curves G3 and G4 represent the characteristics of the leakage current when the $HfO_2$ layer 12 has a thickness of about 4.5 nm. Further, the first and third curves G1 and G3 each represent leakage current density when the $HfO_2$ layer 12 is deposited to a thickness less than a target thickness. The second and fourth curves G2 and G4 each represent the leakage current density when the $HfO_2$ layer 12 is deposited to the target thickness. Comparing the first and second curves G1 and G2 with the third and fourth curves G3 and G4, it may be seen that the leakage current of the capacitor significantly increases when the $HfO_2$ layer 12 has a thickness of about 4.5 nm.

FIG. 3 illustrates a cross-sectional view of a conventional capacitor having a relatively complicated structure including a ferroelectric layer. FIG. 4 is a graph illustrating a ratio of atoms included in the ferroelectric layer of FIG. 3, measured at a plurality of points in the capacitor of FIG. 3;

In an alternative conventional capacitor, a ferroelectric layer M3 having multi-components, such as an STO (Sr-$TiO_3$) layer, may be used, instead of the $HfO_2$ layer 12. The alternative conventional capacitor shown in FIG. 3 includes a silicon oxide ($SiO_2$) layer M1, a lower electrode M2, and the ferroelectric layer M3. An upper electrode is not shown in the capacitor of FIG. 3.

When the capacitor has a complicated structure, like the capacitor in FIG. 3, a ratio of positive ions in the ferroelectric layer M3 changes and an electrical characteristic of the capacitor is degraded. Referring to FIG. 4, fifth curve G5 represents a ratio of Sr to Ti in the ferroelectric layer M3, e.g., the STO layer, which is measured at a plurality of points 1–9 in the capacitor of FIG. 3.

According to the fifth curve G5, a content of Sr at a top surface of the ferroelectric layer M3, i.e., at point 1, is considerably greater than that of Ti. The content of Sr at a bottom surface of the ferroelectric layer M3, i.e., at point 9, however, is slightly less than that of Ti.

SUMMARY OF THE INVENTION

The present invention is therefore directed to a capacitor of a semiconductor device and a memory device using the same, which substantially overcome one or more of the problems due to the limitations and disadvantages of the related art.

It is a feature of an embodiment of the present invention to provide a capacitor of a semiconductor device, including a dielectric layer, which has a thickness of the order of nanometers to tens of nanometers.

It is another feature of an embodiment of the present invention to provide a capacitor of a semiconductor device having large capacitance and an excellent leakage current characteristic.

It is another feature of an embodiment of the present invention to provide a highly-reliable memory device including a capacitor according to an embodiment of the present invention.

At least one of the above and other features and advantages of the present invention may be realized by providing a capacitor of a semiconductor device including a lower electrode, a dielectric layer, including a plurality of band gaps, formed on the lower electrode, and an upper electrode formed on the dielectric layer.

At least one of the above and other features and advantages of the present invention may be realized by providing a memory device of a semiconductor device including a transistor, and a capacitor connected to the transistor, wherein the capacitor includes a lower electrode connected to the transistor, a dielectric layer, including a plurality of band gaps, formed on the lower electrode, and an upper electrode formed on the dielectric layer.

In either embodiment, a band gap of the plurality of band gaps in the dielectric layer that is not adjacent to either the lower electrode or the upper electrode may be smaller than a band gap of the plurality of band gaps in the dielectric layer adjacent to the lower electrode and a band gap of the plurality of band gaps in the dielectric layer adjacent to the upper electrode.

In either embodiment, the dielectric layer may include a first dielectric layer having a first band gap formed on the lower electrode, a second dielectric layer having a second band gap formed on the first dielectric layer, and a third dielectric layer having a third band gap formed on the second dielectric layer.

In either embodiment, the first through third band gaps may satisfy the following inequality: the second band gap<the first band gap=the third band gap. The first through third band gaps may satisfy the following inequality: the second band gap<the first band gap<the third band gap. The first through third band gaps may satisfy the following inequality: the second band gap<the third band gap<the first band gap.

In either embodiment, the capacitor may further include a fourth dielectric layer having a fourth band gap, which is between the first and second band gaps, between the first and second dielectric layers. The capacitor may further include a fourth dielectric layer having a fourth band gap, which is between the second and third band gaps, between the second and third dielectric layers. In an embodiment having a fourth dielectric layer between the first and second dielectric layers, the capacitor may further include a fifth dielectric layer having a fifth band gap, which is between the second and third band gaps, between the second and third dielectric layers.

In either embodiment, the first through third dielectric layers may each have a thickness between about 2 nm–10 nm. The first dielectric layer may be one selected from the group consisting of an $HfO_2$ layer, an $Al_2O_3$ layer, an $La_2O_3$ layer and a $Pr_2O_3$ layer. The second dielectric layer may be one selected from the group consisting of a $TiO_2$ layer, a $Ta_2O_5$ layer, an $SrTiO_3$ layer, a $BaTiO_3$ layer, a $PbTiO_3$ layer, a $(Ta, Nb)_2O_5$ layer, and a $(Ta, W)_2O_5$ layer. The third dielectric layer may be one selected from the group consisting of an $HfO_2$ layer, an $Al_2O_3$ layer, an $La_2O_3$ layer and a $Pr_2O_3$ layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
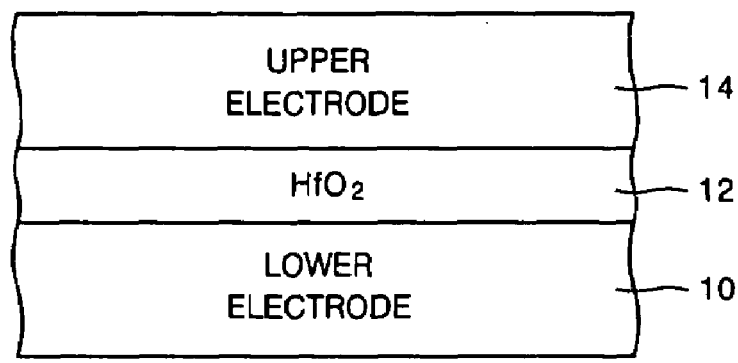
FIG. 1 illustrates a cross-sectional view of a conventional capacitor included in a semiconductor device.

Korean Patent Application No. 2003-56034, filed on Aug. 13, 2003, in the Korean Intellectual Property Office, and entitled: "Capacitor of a Semiconductor Device and Memory Device Using the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 5A–5G illustrate cross-sectional views of a capacitor of a semiconductor device according to various embodiments of the present invention.

Figure 5A:
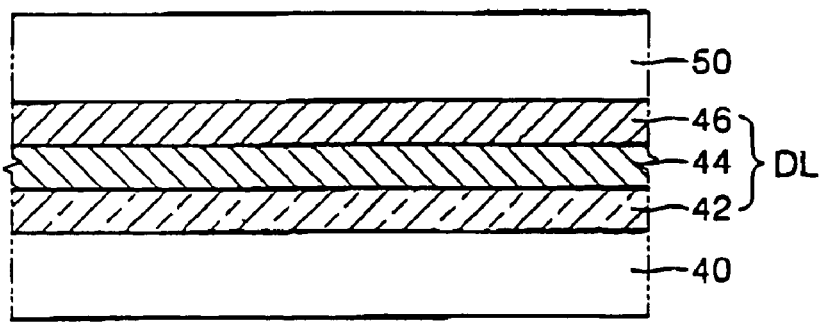
FIGS. 5A–5G illustrate cross-sectional views of a capacitor of a semiconductor device according to various embodiments of the present invention.

Referring to FIG. 5A, a capacitor according to an embodiment of the present invention includes a lower electrode 40 and an upper electrode 50, which faces the lower electrode 40.

The lower electrode 40 may be a silicon (Si) layer, in which conductive impurities are doped. Alternatively, other conductive layers, such as a titanium nitride (TiN) layer, may be used. The upper electrode 50 may be a TiN layer. Alternatively, other conductive layers, such as an Si layer, in which conductive impurities are doped, may be used. A dielectric layer DL is present between the lower electrode 40 and the upper electrode 50.

The dielectric layer DL may be formed by sequentially depositing dielectric layers having different band gaps, thereby having different dielectric constants.

More specifically, the dielectric layer DL may be formed by sequentially forming three dielectric layers. That is, a first dielectric layer 42 is formed on the lower electrode 40, a second dielectric layer 44 is formed on the first dielectric layer 42, and a third dielectric layer 46 is formed on the second dielectric layer 44. The first dielectric layer 42 has a first band gap, the second dielectric layer 44 has a second band gap, and the third dielectric layer 46 has a third band gap. In an embodiment of the present invention, the second band gap may be smaller than the first band gap and the third band gap. Further, the first and third band gaps may be equivalent.

If the first through third dielectric layers 42, 44, and 46 have the above band gap distribution, electrons passing through one of the dielectric layers having a relatively large band gap, e.g., the third dielectric layer 46, encounter a dielectric layer having a smaller band gap, i.e., the second dielectric layer 44, and cause phonon scattering. Thus, the electrons cannot pass through the band gap adjacent to the second dielectric layer 44, i.e., the first dielectric layer 42.

As a result, the leakage current of the dielectric layer DL is reduced. The leakage current is reduced due to the relationships of the band gaps of the first through third dielectric layers 42, 44, and 46 forming the dielectric layer DL rather than the thicknesses of the first through third dielectric layers 42, 44, and 46. Thus, even if the first through third dielectric layers 42, 44, and 46 are made relatively thin, the leakage current characteristic of the dielectric layer DL can be well maintained. Therefore, the dielectric layer DL may be formed to have a relatively thin thickness. For example, the first through third dielectric layers 42, 44, and 46 may each be formed to a thickness of between about 2 nm–10 nm.

Each of the first through third dielectric layers 42, 44, and 46 may have the same thickness in a range of between about 2 nm–10 nm.

Each of the first and third dielectrics layers 42 and 46 may be one selected from the group consisting of a hafnium oxide layer ($HfO_2$), an aluminium oxide layer ($Al_2O_3$) and a praseodymium oxide layer ($Pr_2O_3$). The second dielectric layer 44 may be a titanium oxide layer ($TiO_2$), or may also be one selected from the group consisting of a tantalum oxide layer ($Ta_2O_5$), an STO ($SrTiO_3$) layer, a BTO ($BaTiO_3$) layer, a PTO ($PbTiO_3$) layer, a TNO (($Ta, Nb)_2O_5$) layer, and a TWO (($Ta, W)_2O_5$).

Experiments to test the superiority of the leakage current characteristic of the capacitor according to an embodiment of the present invention will now be described.

In a first experiment, the first through third dielectric layers 42, 44, and 46 are formed with an LaO layer, a $TiO_2$ layer, and an LaO layer, respectively. In a second experiment, the first through third dielectric layers 42, 44, and 46 are formed with a $HfO_2$ layer, a $TiO_2$ layer, a $HfO_2$ layer, respectively. The total thickness of the first through third dielectric layers 42, 44, and 46 are formed to be about a nano-thick.

Figure 6:
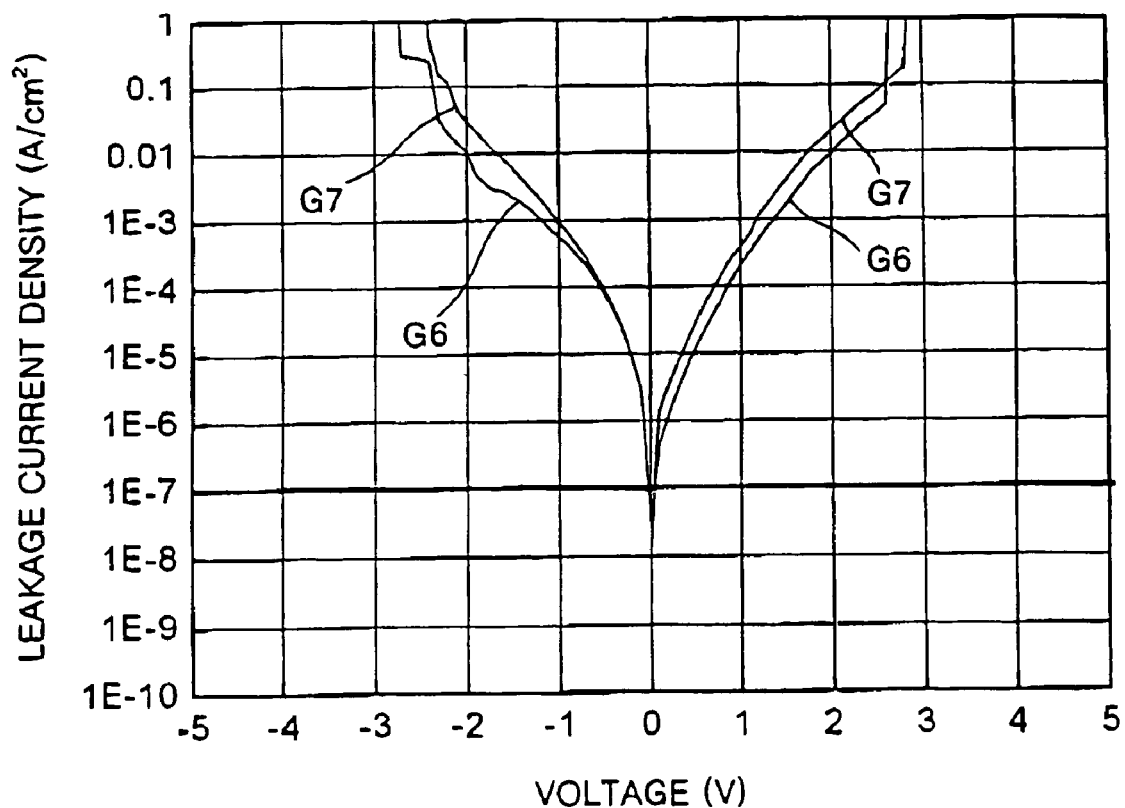
FIG. 6 is a graph illustrating leakage current density of the capacitor of FIG. 5A, the leakage current density being measured before stacking a dielectric layer.
Figure 7:
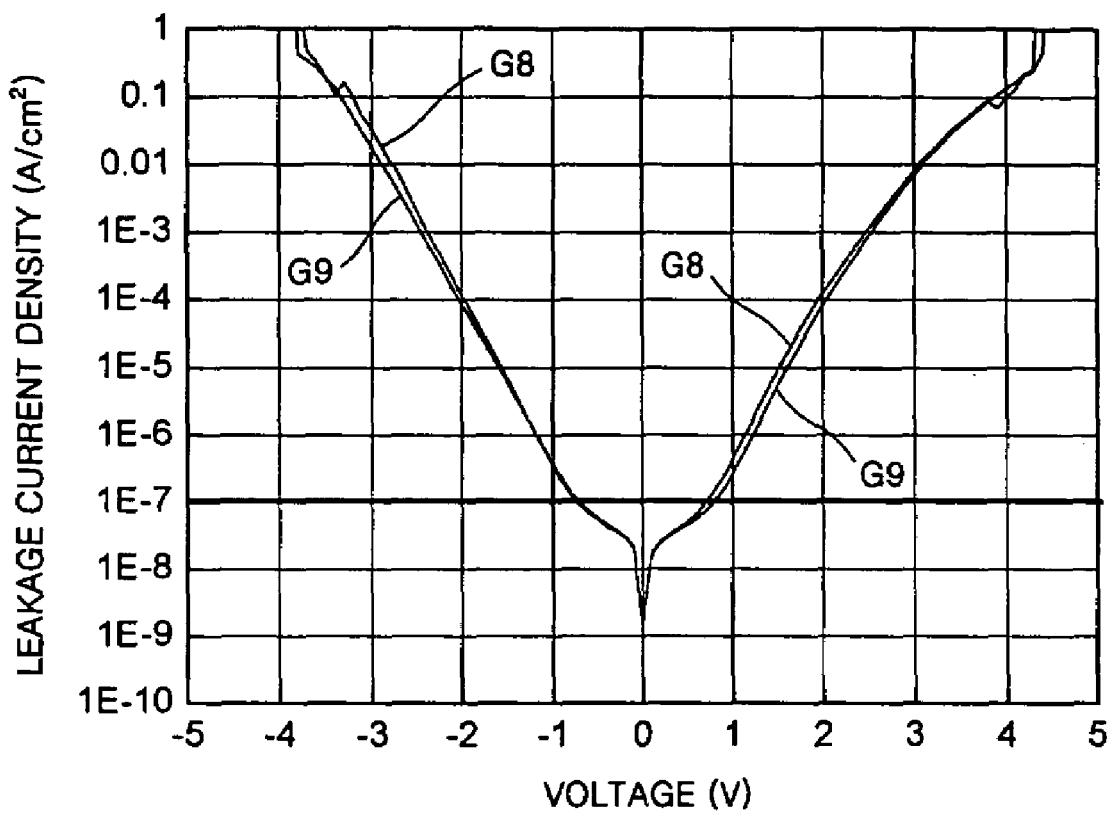
FIG. 7 is a graph illustrating leakage current density of the capacitor of FIG. 5A, the leakage current density being measured after stacking a dielectric layer.

FIGS. 6 and 7 are graphs showing the results of the above experiments.

FIG. 6 illustrates a first leakage current density measured before stacking the first through third dielectric layers 42, 44, and 46 to a target thickness, e.g., measured after stacking only the first dielectric layer 42. FIG. 7 illustrates a second leakage current density of the capacitor of FIG. 5A after completely forming the first through third dielectric layers 42, 44, and 46 to the target thickness.

Referring to FIGS. 6 and 7, sixth and eighth curves G6 and G8 represent the leakage current density measured at a first location on a substrate, which is placed horizontally. Seventh and ninth curves G7 and G9 represent the leakage current density measured at a second location on the substrate.

The first location may be a location near a flat zone of the substrate and the second location may be another location on an opposite side of the flat zone.

It may be seen from a comparison of the graphs of FIG. 6 with the graphs of FIG. 7 that the second leakage current density is much less than the first current density.

Figure 2:
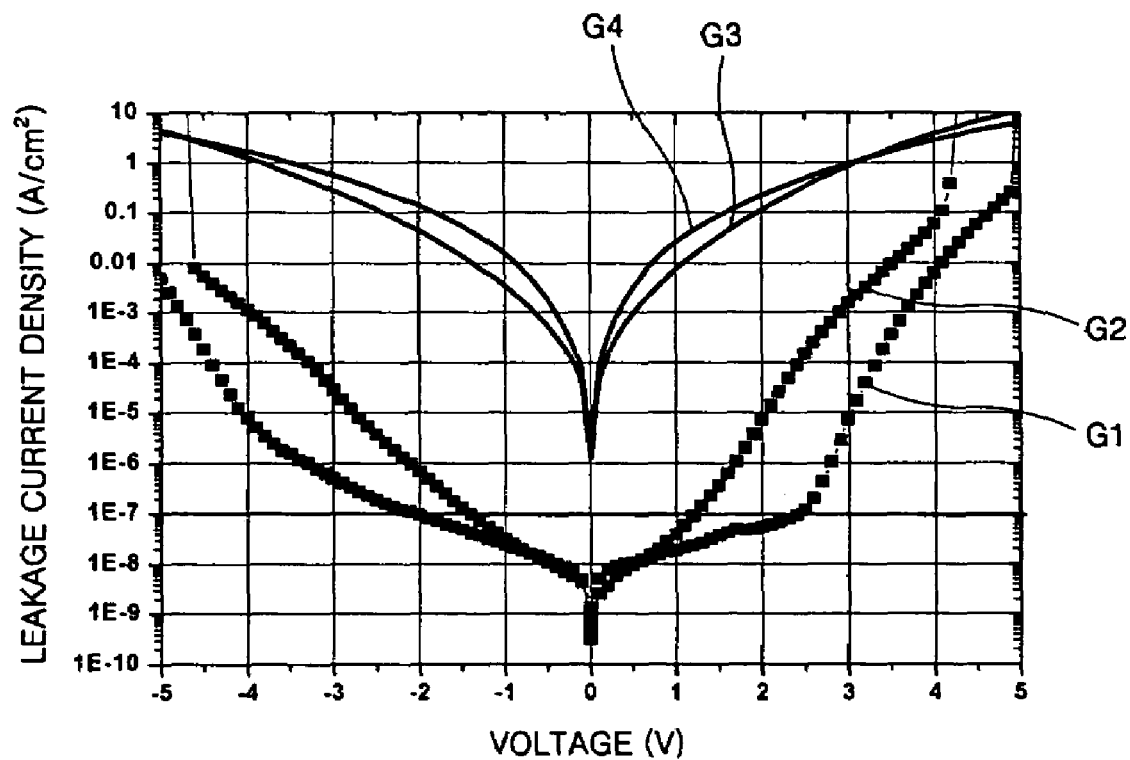
FIG. 2 is a graph illustrating a leakage current density of the capacitor of FIG. 1 according to a thickness of a hafnium oxide ($HfO_2$) layer included in the capacitor of FIG. 1.
Figure 3:
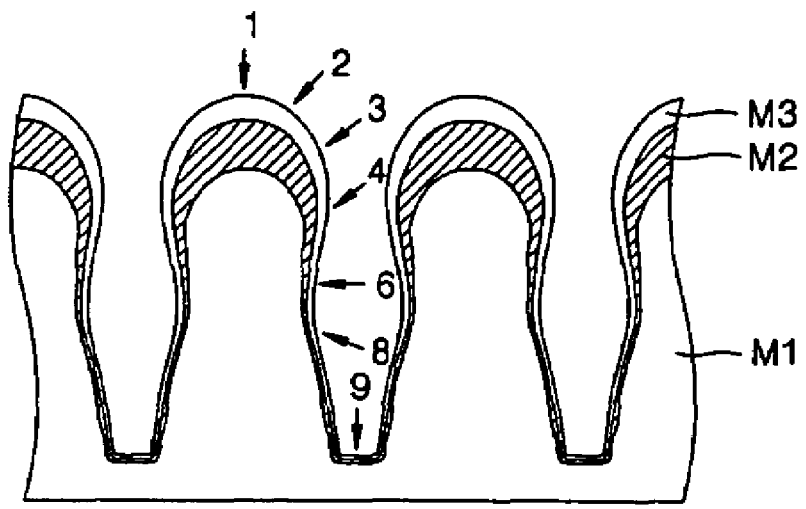
FIG. 3 illustrates a cross-sectional view of another conventional capacitor having a relatively complicated structure including a ferroelectric layer.
Figure 4:
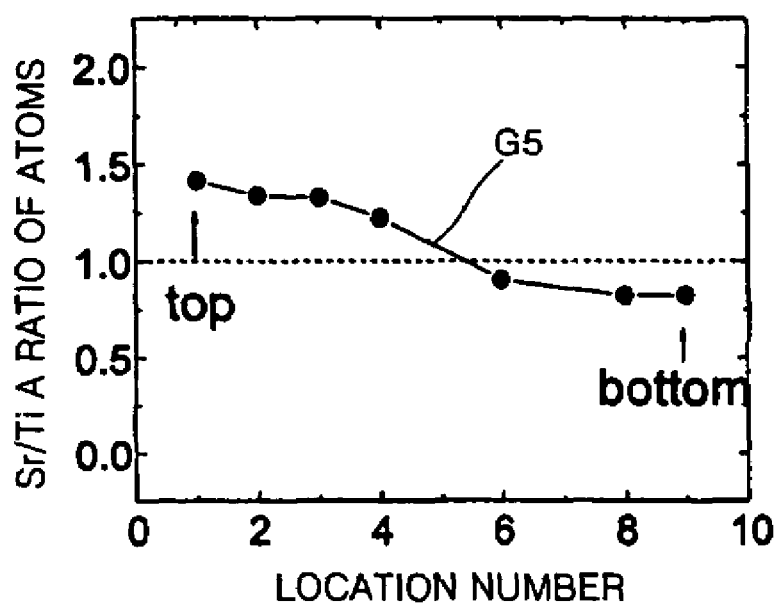
FIG. 4 is a graph illustrating a ratio of atoms included in the ferroelectric layer of FIG. 3, the ratio of atoms being measured at a plurality of points in the capacitor of FIG. 3.

Furthermore, when comparing the third and fourth curves G3 and G4 of FIG. 2 with the eighth and ninth curves G8 and G9 of FIG. 7, when a predetermined voltage, for example, ±1V, is applied, leakage current density of the conventional capacitor is about 0.01 $A/cm^2$, but the leakage current intensity of the capacitor according to an embodiment of the present invention ranges between 1E-7 $A/cm^2$ and 1E-6 $A/cm^2$.

Thus, the leakage current density of the capacitor according to an embodiment of the present invention is significantly lower than that of the conventional capacitor. Thus, the capacitance of the capacitor according to an embodiment of the present invention is significantly greater than that of the conventional capacitor.

The capacitor of FIG. 5A can be formed by successively stacking the first through third dielectric layers 42, 44, and 46 on the lower electrode 40 and then stacking the upper electrode 50 on the third dielectric layer 46. Further, the first through third dielectric layers 42, 44, and 46 may be formed to have a thickness in a range of between about 2 nm and 10 nm.

A chemical vapor deposition (CVD) method may also be used to form the first through third dielectric layers 42, 44 and 46. Considering that the first through third dielectric layers 42, 44 and 46 are formed to a thickness on a nano-level, the first through third dielectric layers 42, 44, and 46 may be formed using an atomic layer deposition (ALD).

In alternative embodiments of the capacitor of the present invention, the first and third dielectric layers 42 and 46 may be replaced with dielectric layers which have different band gaps, but are larger than that of the second dielectric layer 44.

Figure 5B:
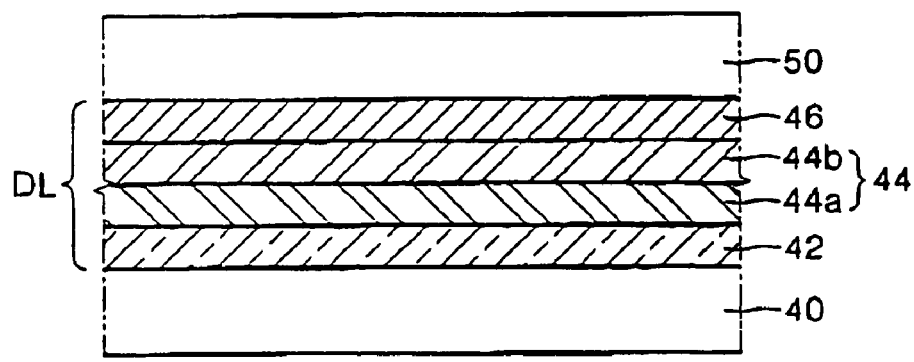

Furthermore, as shown in FIG. 5B, the second dielectric layer 44 may be replaced with two dielectric layers 44a and 44b having the second band gap.

Figure 5C:
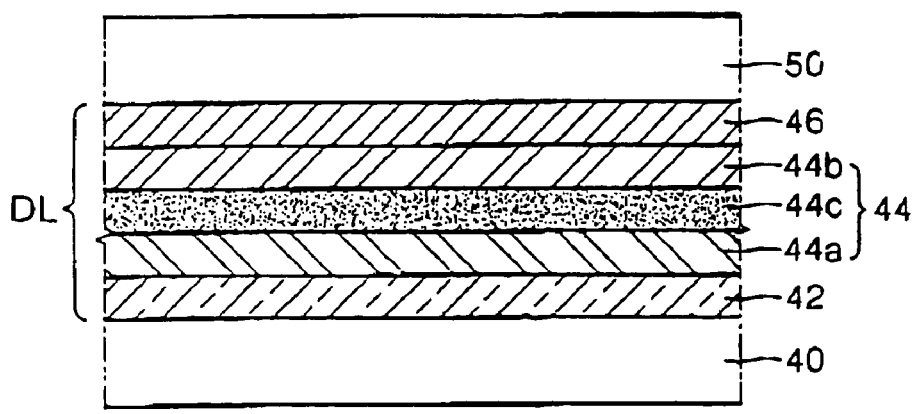
Figure 5D:
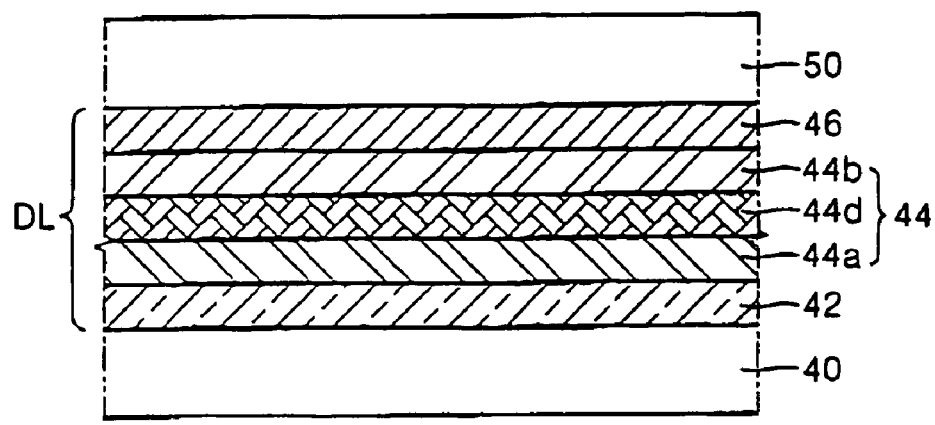

In addition, as shown in FIG. 5C, the second dielectric layer 44 may include another dielectric layer 44c having the same band gap as the first or third dielectric layers between the two dielectric layers 44a and 44b. Alternatively, as shown in FIG. 5D, the dielectric layer 44c may be replaced with a dielectric layer 44d having a band gap smaller than that of the second dielectric layer 44.

Figure 5E:
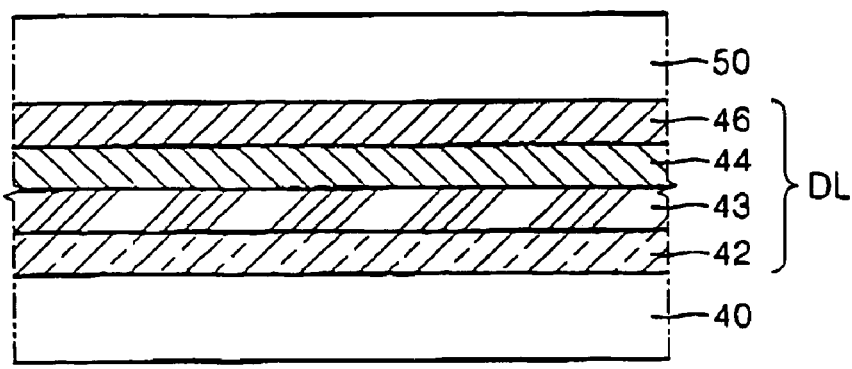
Figure 5F:
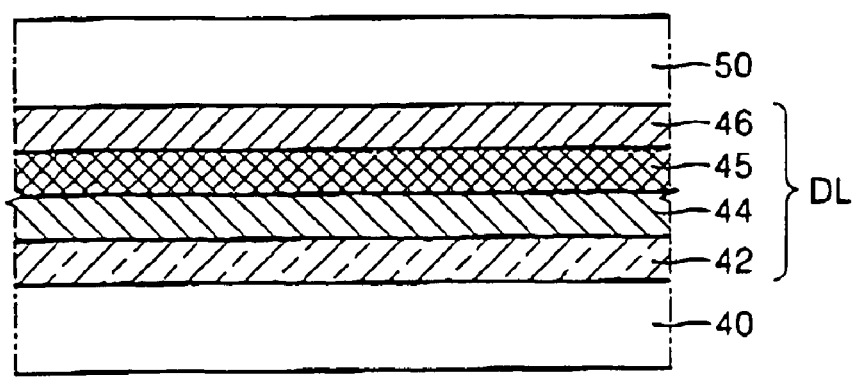
Figure 5G:
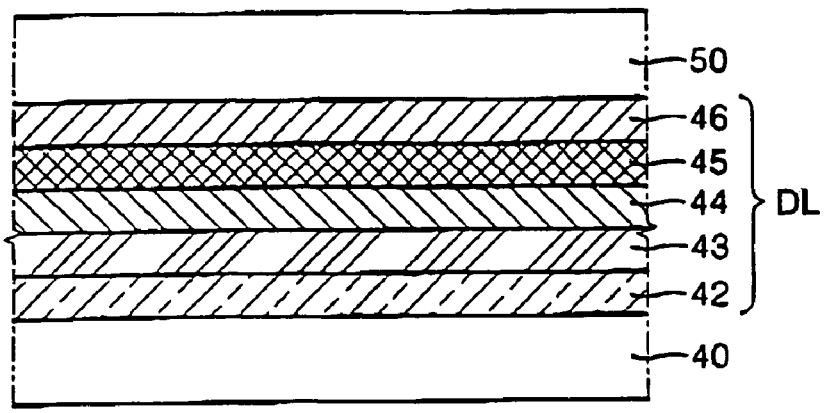

Alternatively, as shown in FIG. 5E, the capacitor may include a fourth dielectric layer 43 having a fourth band gap, which is between the first and second band gaps, between the first and second dielectric layers 42 and 44. As shown in FIG. 5F, the capacitor may further include a fifth dielectric layer 45 having a fifth band gap, which is between the second and third band gaps, between the second and third dielectric layers 44 and 46. The fifth dielectric layer 45 may be replaced with the fourth dielectric layer 43. As a further alternative, as shown in FIG. 5G, the capacitor may include the fourth and fifth dielectric layers 43 and 45.

A memory device including the capacitor of FIG. 5A will now be described.

Figure 8:
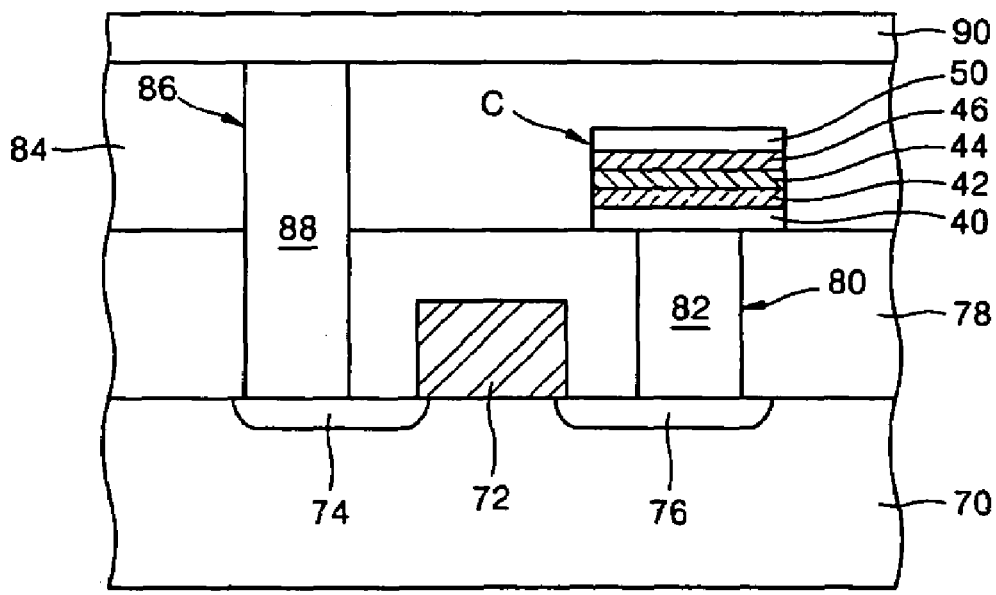
FIG. 8 illustrates a cross-sectional view of a memory device including the capacitor of the semiconductor device of FIG. 5A according to an embodiment of the present invention.

FIG. 8 illustrates a cross-sectional view of a memory device including the capacitor of the semiconductor device of FIG. 5A according to an embodiment of the present invention.

Referring to FIG. 8, the memory device includes a substrate 70. The substrate 70 includes first and second areas 74 and 76, in which impurities are injected, and which are separated by a predetermined distance. The first area 74 is a source area and the second area 76 is a drain area. A channel area is located in the substrate 70 between the first and second areas 74 and 76 and a gate stacking material 72 is formed on the channel area. The gate stacking material 72 turns the channel area on or off according to the applied voltage. The gate stacking material 72 includes a gate insulating layer (not shown) and a gate conductive layer (not shown). The substrate 70, the first and second areas 74 and 76, and the gate stacking material 72 constitute a MOSFET. A first interlayer insulating layer 78 covering the gate stacking material 72 is formed on the substrate 70. A first contact hole 80 that exposes a portion of the second area 76 is formed in the first interlayer insulating layer 78. The first contact hole 80 is filled with a first conductive plug 82, e.g., polysilicon doped with conductive impurities. A capacitor C covering the first conductive plug 82 is formed on the first interlayer insulating layer 78. The capacitor C may be the capacitor shown in FIG. 5A or another capacitor according to another embodiment of the present invention. The lower electrode 40 of the capacitor C and the first conductive plug 82 may be formed with the same conductive material, or different conductive materials may be used. A second interlayer insulating layer 84 covering the capacitor C is formed on the first interlayer insulating layer 78. A second contact hole 86 that exposes a portion of the first area 74 is formed in the first and second interlayer insulating layers 78 and 84. The second contact hole 86 is filled with a second conductive plug 88. The second conductive plug 88 may be polysilicon doped with conductive impurities, or other conductive materials may be used. A conductive layer 90 covering the second conductive plug 88 is formed on the second interlayer insulating layer 84. The conductive layer 90 is a bit line and is vertical to the gate stacking material 72. The conductive layer 90 and the second conductive plug 88 may be formed with the same conductive material, or different conductive materials may be used.

In the memory device by the present invention, data stored in the capacitor is able to be maintained for a long time in a normal state. That is, data stored in the capacitor can be read normally even when the data is read after having been stored for an extended length of time, thereby enhancing the reliability of the memory device.

As described above, the dielectric layer of a capacitor according to the exemplary embodiments of the present invention includes a plurality of dielectric layers having different band gaps. Electrons that pass through the dielectric layers that have a relatively large band gap as compared to the other dielectric layers cause phonon scattering when they reach a dielectric layer having a smaller band gap. Therefore, the electrons cannot pass through another dielectric layer having a relatively large band gap that is adjacent to the dielectric layer having the small band gap. Thus, even if the dielectric layer of the capacitor has a thickness on a nano-level, the leakage current of the capacitor is not increased. In addition, the thickness of the dielectric layer may have a thickness on a nano-level. Resultantly, the capacitance of the capacitor is largely enhanced.

Exemplary embodiments of the present invention have been disclosed herein and, although specific terms are employed, they are used and are to be interpreted in a generic and descriptive sense only and not for purpose of limitation. For example, a capacitor according to an embodiment of the present invention may also be used in other memory devices besides the memory device of FIG. 8. Accordingly, it will be understood by those of ordinary skill in the art that various changes in form and details may be made without departing from the spirit and scope of the present invention as set forth in the following claims.

What is claimed is:

1. A capacitor of a semiconductor device, comprising:
   a lower electrode;
   a stack of dielectric layers, the stack including a first dielectric layer formed on the lower electrode, a second dielectric layer formed on the first dielectric layer, and a third dielectric layer formed on the second dielectric layer; and
   an upper electrode formed on the third dielectric layer,
   wherein a band gap in the second dielectric layer is smaller than a band gap in the first dielectric layer and smaller than a band gap in the third dielectric layer.

2. The capacitor as claimed in claim 1, wherein the band gap in the first dielectric layer is substantially eciual to the band gap in the third dielectric layer.

3. The capacitor as claimed in claim 1, wherein the band gap in the first dielectric layer is smaller than the band gap in the third dielectric layer.

4. The capacitor as claimed in claim 1, wherein the band gap in the third dielectric layer is smaller than the band gap in the first dielectric layer.

5. The capacitor as claimed in claim 1, further comprising a fourth dielectric layer disposed between the first and second dielectric layers,
   wherein a band gap in the fourth dielectric layer is smaller than the band gap in the first dielectric layer and greater than the band gap in the second dielectric layer.

6. The capacitor as claimed in claim 1, further comprising a fourth dielectric layer disposed between the second and third dielectric layers,
   wherein a band gap in the fourth dielectric layer is smaller than the band gap in the third dielectric layer and greater than the band gap in the second dielectric layer.

7. The capacitor as claimed in claim 1, wherein the first through third dielectric layers each have a thickness between about 2 nm and 10 nm.

8. The capacitor as claimed in claim 1, wherein the first dielectric layer is selected from the group consisting of a $HfO_2$ layer, a $Al_2O_3$ layer, a $La_2O_3$ layer and a $Pr_2O_3$ layer.

9. The capacitor as claimed in claim 1, wherein the second dielectric layer is selected from the group consisting of a $TiO_2$ layer, a $Ta_2O_5$ layer, a $SrTiO_3$ layer, a $BaTiO_3$ layer, a $PbTiO_3$ layer, a $(Ta, Nb)_2O_5$ layer, and a $(Ta, W)_2O_5$ layer.

10. The capacitor as claimed in claim 1, wherein the third dielectric layer is selected from the group consisting of a $HfO_2$ layer, a $Al_2O_3$ layer, a $La_2O_3$ layer and a $Pr_2O_3$ layer.

11. The capacitor as claimed in claim 5, further comprising a fifth dielectric layer disposed between the second and third dielectric layers,
    wherein a band gap in the fifth dielectric layer is smaller than the band gap in the third dielectric layer and greater than the band gap in the second dielectric layer.

12. A memory device of a semiconductor device, comprising:
    a transistor; and
    a capacitor connected to the transistor, wherein the capacitor includes:
       a lower electrode connected to the transistor,
       a stack of dielectric layers, the stack including a first dielectric layer formed on the lower electrode, a second dielectric layer formed on the first dielectric layer, and a third dielectric layer formed on the second dielectric layer; and
       an upper electrode formed on the third dielectric layer,
    wherein a band gap in the second dielectric layer is smaller than a band gap in the first dielectric layer and smaller than a band gap in the third dielectric layer.

13. The memory device as claimed in claim 12, wherein the band gap in the first dielectric layer is substantially equal to the band gap in the third dielectric layer.

14. The memory device as claimed in claim 12, wherein the band gap in the first dielectric layer is smaller than the band gap in the third dielectric layer.

15. The memory device as claimed in claim 12, wherein the band gap in the third dielectric layer is smaller than the band gap in the first dielectric layer.

16. The memory device as claimed in claim 12, further comprising a fourth dielectric layer disposed between the first and second dielectric layers,
    wherein a band gap in the fourth dielectric layer is smaller than the band gap in the first dielectric layer and greater than the band gap in the second dielectric layer.

17. The memory device as claimed in claim 12, further comprising a fourth dielectric layer disposed between the second and third dielectric layers, wherein a band gap in the fourth dielectric layer is smaller than the band gap in the third dielectric layer and greater than the band gap in the second dielectric layer.

18. The memory device as claimed in claim 12, wherein the first through third dielectric layers have a thickness between about 2 nm and 10 nm.

19. The memory device as claimed in claim 12, wherein the first dielectric layer is selected from the group consisting of a $HfO_2$ layer, a $Al_2O_3$ layer, a $La_2O_3$ layer, and a $Pr_2O_3$ layer.

20. The memory device as claimed in claim 12, wherein the second dielectric layer is selected from the group consisting of a $TiO_2$ layer, a $Ta_2O_5$ layer, a $SrTiO_3$ layer, a $BaTiO_3$ layer, a $PbTiO_3$ layer, a $(Ta, Nb)_2O_5$ layer, and a $(Ta, W)_2O_5$ layer.

21. The memory device as claimed in claim 12, wherein the third dielectric layer is selected from the group consisting of a $HfO_2$ layer, a $Al_2O_3$ layer, a $La_2O_3$ layer, and a $Pr_2O_3$ layer.

22. The memory device as claimed in claim 16, further comprising a fifth dielectric layer disposed between the second and third dielectric layers, wherein a band gap in the fifth dielectric layer is smaller than the band gap in the third dielectric layer and greater than the band gap in the second dielectric layer.

* * * * *